United States Patent [19]

Ponnapalli et al.

[11] Patent Number: 5,497,337

[45] Date of Patent: Mar. 5, 1996

[54] METHOD FOR DESIGNING HIGH-Q INDUCTORS IN SILICON TECHNOLOGY WITHOUT EXPENSIVE METALIZATION

[75] Inventors: Saila Ponnapalli, Dutchess County; Mehmet Soyuer; John F. Ewen, both of Westchester County, all of N.Y.

[73] Assignee: International Business Machines Corporation, Armonk, N.Y.

[21] Appl. No.: 327,252

[22] Filed: Oct. 21, 1994

[51] Int. Cl.⁶ ........................................ H03B 7/14
[52] U.S. Cl. .................... 364/489; 364/488; 364/490
[58] Field of Search .................... 364/488, 489, 364/490, 491, 578, 474.24, 468; 333/195, 204, 206; 505/1; 315/111.41; 324/318

[56] References Cited

U.S. PATENT DOCUMENTS

| | | |
|---|---|---|
| 3,598,977 | 8/1971 | Clemmens . |
| 3,622,762 | 11/1971 | Dyer et al. . |
| 4,071,903 | 1/1978 | Head et al. . |
| 4,351,983 | 9/1982 | Crouse et al. . |
| 4,542,356 | 9/1985 | Nakazawa et al. ............... 333/195 |
| 4,672,669 | 6/1987 | DesBlanche et al. . |
| 4,677,671 | 6/1987 | Galand et al. . |
| 4,764,966 | 8/1988 | Einkauf et al. . |
| 4,841,574 | 6/1989 | Pham et al. . |

(List continued on next page.)

OTHER PUBLICATIONS

"Three–Dimensional Inductance Computations with Partial Element Equivalent Circuits", by Pierce Brennan, Norman Raver and Albert Ruehli, IBM J. Res. Develop., vol. 23, No. 6, Nov. 1979, 661–668.

"Frequency–Dependent Inductance and Resistance Calculation for Three–Dimensional Structure in High–Speed Interconnect Systems", by A. C. Cangellaries, J. L. Prince and L. Vakanas, IEEE Trans. Compon. Hybrids Manuf. Tech. vol. 13, No. 1, Mar. 1990, 398–403.

"Capacitance Calculation of IC Packages Using the Finite Element Method and Planes of Symmetry", by Tai–Yu Chou and Zoltan Cendes, IEEE Trans. on Computer–Aided Design of Integrated Circuits and Systems, vol. 13, No. 9, Sep. 1994, 1159–1166.

"Inductance Calculations in a Complex Integrated Circuit Environment", by A. E. Ruehli, IBM J. Res. Develop., Sep. 1972, 470–481.

"Equivalent Circuit Models for Three–Dimensional Multiconductor Systems", by A. E. Ruehli, IEEE Trans. on Microwave Theory and Techniques, vol. MTT–22, No. 3, Mar. 1974, 216–221.

"Efficient Capacitance Calculations for Three–Dimensional Multiconductor Systems", by A. E. Ruehli and P. A. Brennan, IEEE Trans. on Microwave Theory and Techniques, vol. MTT–21, No. 2, Feb. 1973, 76–82.

"Inductance of Nonstraight Conductors Close to a Ground Return Plane", by A. E. Ruehli, N. Kulasza and J. Pivnichny, IEEE Trans. on Microwave Theory and Techniques, Aug. 1975, 706–708.

"A Package Analysis Tool Based on a Method of Moments Surface Formulation", by S. Ponnapalli, A. Deutsch and R. Bertin, IEEE Trans. on Components, Hybrids and Manufacturing Technology, vol. 16, No. 8, Dec. 1993, 884–892.

"IDEAS–An Integrated Design Automation System", by Mehmood et al., 1987 International Conference on Computer Design: VLSI in Computers and Processors, Oct. 5–8, 1987, pp. 407–412.

IBM Technical Disclosure Bulletin, vol. 32, No. 6B, Nov. 1989, pp. 310–317, "Programmable Substrate Inductor", by A. A. Mello.

*Primary Examiner*—Kevin J. Teska
*Assistant Examiner*—Russell W. Frejd
*Attorney, Agent, or Firm*—Whitham, Curtis, Whitham, & McGinn

[57] ABSTRACT

A method of designing a high Q inductor for implementation in multiple metalization levels in conventional integrated circuit technology uses a software assisted iterative technique to achieve a design Q factor. The inductor turns utilize the multiple metalization levels to reduce inductor resistance.

5 Claims, 4 Drawing Sheets

U.S. PATENT DOCUMENTS

| | | |
|---|---|---|
| 4,907,277 | 3/1990 | Callens et al. . |
| 4,924,508 | 5/1990 | Creyp et al. . |
| 4,933,860 | 6/1990 | Liu ................................. 364/490 |
| 4,933,957 | 6/1990 | Bottau et al. . |
| 4,981,838 | 1/1991 | Whitehead ......................... 505/1 |
| 5,001,758 | 3/1991 | Galand et al. . |
| 5,007,092 | 4/1991 | Galand et al. . |
| 5,010,495 | 4/1991 | Willetts . |
| 5,031,218 | 7/1991 | Galand et al. . |
| 5,073,941 | 12/1991 | Locke . |
| 5,113,011 | 5/1992 | Witzeman et al. . |
| 5,124,675 | 6/1992 | Komazaki et al. ................. 333/204 |
| 5,133,011 | 7/1992 | McKiel, Jr. . |
| 5,142,583 | 8/1992 | Galand et al. . |
| 5,230,037 | 7/1993 | Giustiniani et al. . |
| 5,231,669 | 7/1993 | Galand et al. . |
| 5,241,245 | 8/1993 | Barnes et al. .................... 315/111.41 |
| 5,276,398 | 1/1994 | Withers et al. ..................... 324/318 |
| 5,285,191 | 2/1994 | Reeb ................................ 340/572 |
| 5,293,451 | 3/1994 | Brown et al. . |
| 5,293,584 | 3/1994 | Brown et al. . |
| 5,297,053 | 3/1994 | Pease et al. ..................... 364/474.24 |
| 5,304,967 | 4/1994 | Hayashi ............................. 333/206 |
| 5,313,398 | 5/1994 | Rohrer et al. ..................... 364/468 |

METHOD FOR DESIGNING HIGH-Q INDUCTORS IN SILICON TECHNOLOGY WITHOUT EXPENSIVE METALIZATION

BACKGROUND OF THE INVENTION

1. Field of the Invention

The present invention generally relates to the design and construction of electrical inductors and, more particularly, to a method for designing inductor structures which are compatible with silicon technology.

2. Description of the Prior Art

Miniaturization of electronic circuits is a goal in virtually every field, not only to achieve compactness in mechanical packaging, but also to decrease the cost of manufacture of the circuits. Many digital and analog circuits, including complex microprocessors and operational amplifiers, have been successfully implemented in silicon based integrated circuits (ICs). These circuits typically include active devices such as bipolar transistors and field effect transistors (FETs), diodes of various types, and passive devices such as resistors and capacitors.

One area that remains a challenge to miniaturize are radio frequency (RF) circuits, such as those used in cellular telephones, wireless modems, and other types of communication equipment. The problem is the difficulty in producing a good inductor in silicon technologies that is suitable for RF applications. Attempts to integrate inductors into silicon technologies have yielded either inductor Q values less than five or required special metalization layers such as gold. This is in part due to the fact that the inductance of spiral on-chip inductors is very difficult to predict, so that design changes to increase inductance and decrease resistance can only be verified using hardware redesigns.

The objective of high-Q inductance designs is to increase inductance and decrease resistance, while keeping parasitic capacitance to a minimum so that high oscillation frequencies can be achieved. Several techniques for doing this can be used. One way is to use wide metal line-widths; however, this increases the inductor area and the parasitic capacitance associated with the structure. Therefore, the self-resonance frequency of the inductor decreases, thereby limiting its useful frequency range. Since the Q is directly proportional to frequency and inversely proportional to the series loss of the inductor, the metal line widths cannot be chosen arbitrarily large.

SUMMARY OF THE INVENTION

It is therefore an object of the present invention to provide a method for designing a high Q inductor structure for implementation in silicon.

According to this invention, there is provided a method of designing a high Q inductor structure with multiple metalization levels in a conventional integrated circuit technology. The method involves using a software tool to predict the resistance, inductance and capacitance of the resonant structure. More particularly, a high Q inductor structure can be formed with multiple metalization levels in a conventional integrated circuit technology in which inductor turns utilize these multiple levels to reduce the inductor resistance. Inductors with Q values above five at radio and microwave frequencies can be integrated on silicon with this approach. The design method according to the invention is an iterative method leading to the design of an optimum high-Q micro-inductor in software. Circuit elements are designed with the aid of a computer software tool. Inductance, capacitance, and resistance can be computed based only on knowledge of physical parameters of layout (physical dimensions, losses in condition and losses in substrate). The process is an iterative process in which the physical dimensions of the inductor design are changed each iteration until the desired Q factor is achieved.

BRIEF DESCRIPTION OF THE DRAWINGS

The foregoing and other objects, aspects and advantages will be better understood from the following detailed description of a preferred embodiment of the invention with reference to the drawing, in which.

DETAILED DESCRIPTION OF A PREFERRED EMBODIMENT OF THE INVENTION

Figure 1:
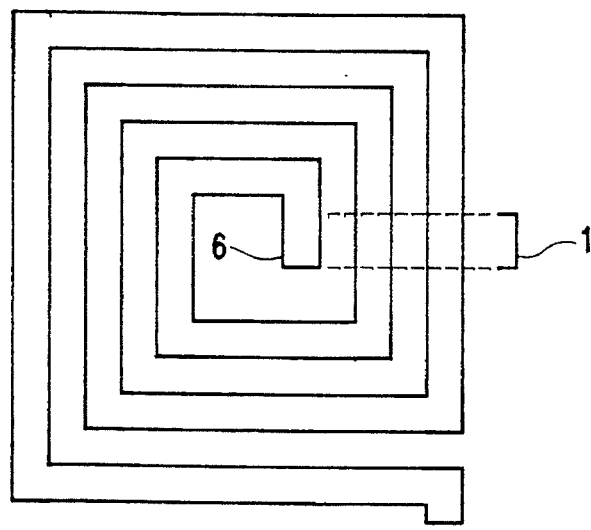
FIG. 1 is a plan view of a spiral inductor structure with three levels of metal according to the invention.
Figure 2:
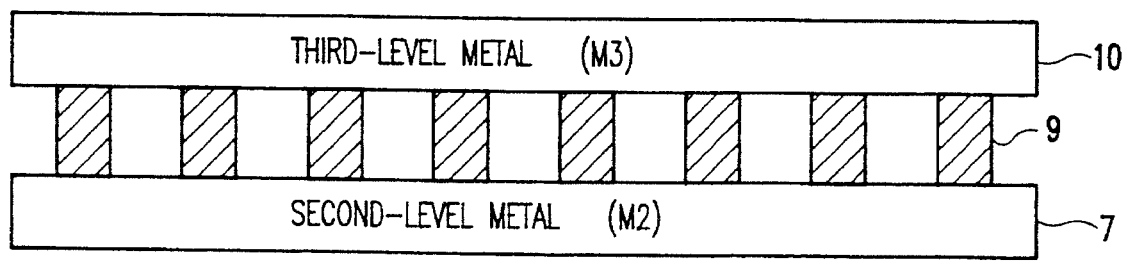
FIG. 2 is a cross section of a spiral line segment.
Figure 3:
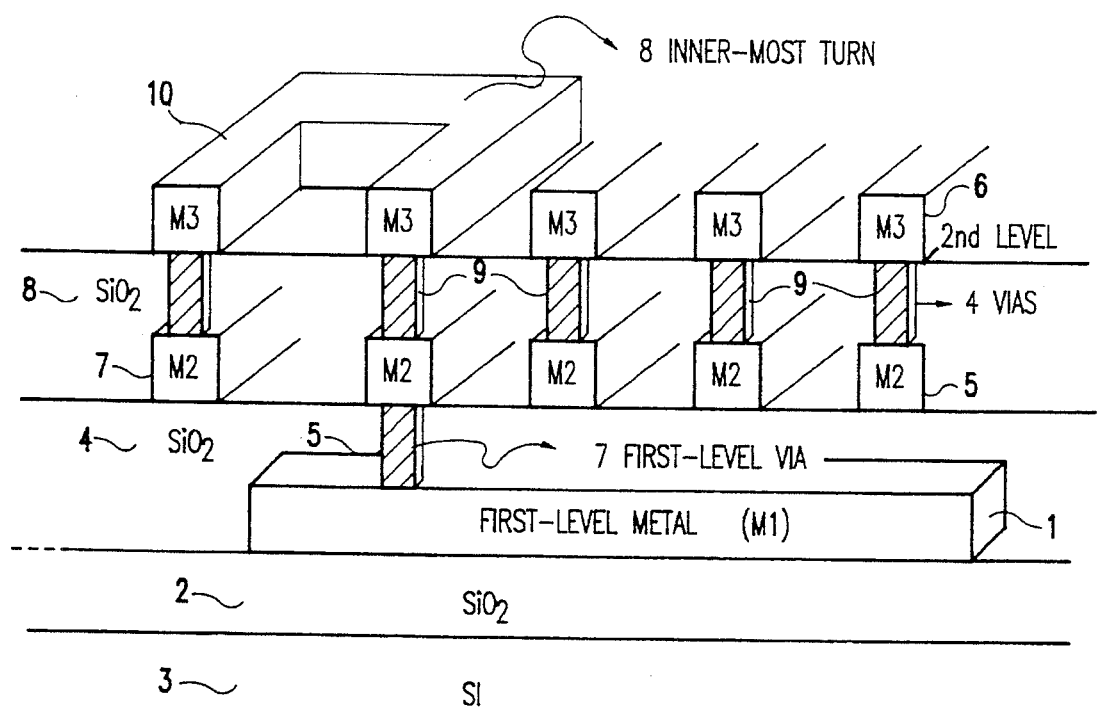
FIG. 3 is a cross-section of inductor showing the cross-under design used to connect to the center terminal of spiral.

Referring now to the drawings, and more particularly to FIG. 1, there is shown a plan view of the spiral inductor structure according to the preferred embodiment of the invention. As shown in FIGS. 2 and 3, this structure has three levels of metal, the first metal level 1 being the first level above a layer silicon oxide 2 on a silicon substrate 3. See FIG. 3. The first metal level 1 is covered by a second layer of silicon dioxide 4 through which a via 5 is formed. The first metal level 1 is used as a cross-under to make connection to the central terminal 6 (FIG. 1 ) of the spiral structure. The via 5 is filed with a metal to interconnect the first level with the second metal level 7. This next level 7 is covered by a third silicon dioxide layer 8 having a plurality of vias 9 formed therein. As shown in FIG. 2, the vias 9 are filled with a metal to interconnect the second metal level 7 to a third metal level 10. The two metal levels 7 and 10 are identical spiral metal patterns, as shown in FIGS. 1 and 3, and the vias 9 effectively shunt the two metal levels. Thus, two layers are used for inductor turns, and these two layers provide two inductors connected in parallel to reduce DC resistance. The reduction in DC resistance for a two layer inductor is at least a factor of two, hence providing a large Q enhancement. Obviously, the DC resistance can be further decreased by shunting more metal layers if extra wiring levels are offered by the technology.

This approach solves the problem of inductor design for high frequency (into the GHz range) applications by employing multiple layers of metal connected with via holes through the isolation levels. Most of the silicon technologies at present have at least three or more metal layers for wiring the circuits. The first metal level has to be used as a cross-under to make a connection to the circled terminal of the spiral structure, as shown in FIG. 1, thus leaving at least two layers to be used for the inductor turns. This invention has been implemented in hardware using a mature BiCMOS (bipolar/complementary metal oxide semiconductor) technology.

Figure 4:
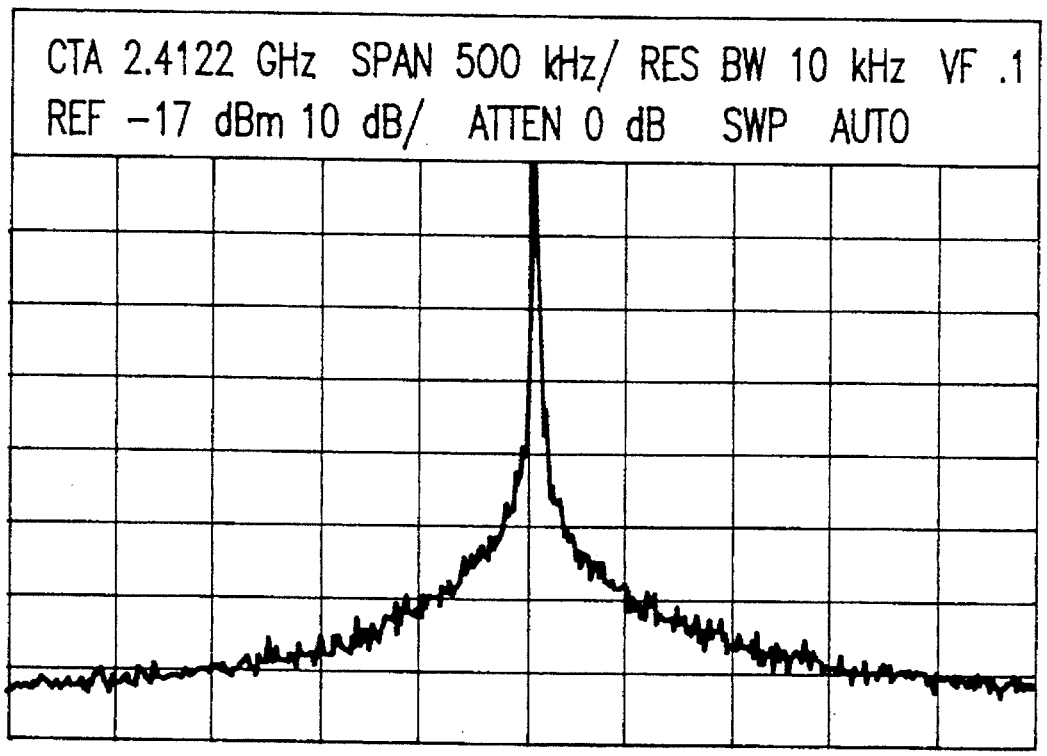
FIG. 4 is a graph showing the frequency spectrum of an oscillator using the inductor shown in FIGS. 1, 2 and 3.

In a specific example, the measured Q of a four-turn spiral inductor was at least seven at 2.4 Ghz. This inductor uses two metal levels to implement the turns and a third one for the cross under. The inductor performed well as part of a resonator in a 2.4 GHz Colpitts bipolar oscillator, as shown in FIG. 4.

Figure 5:
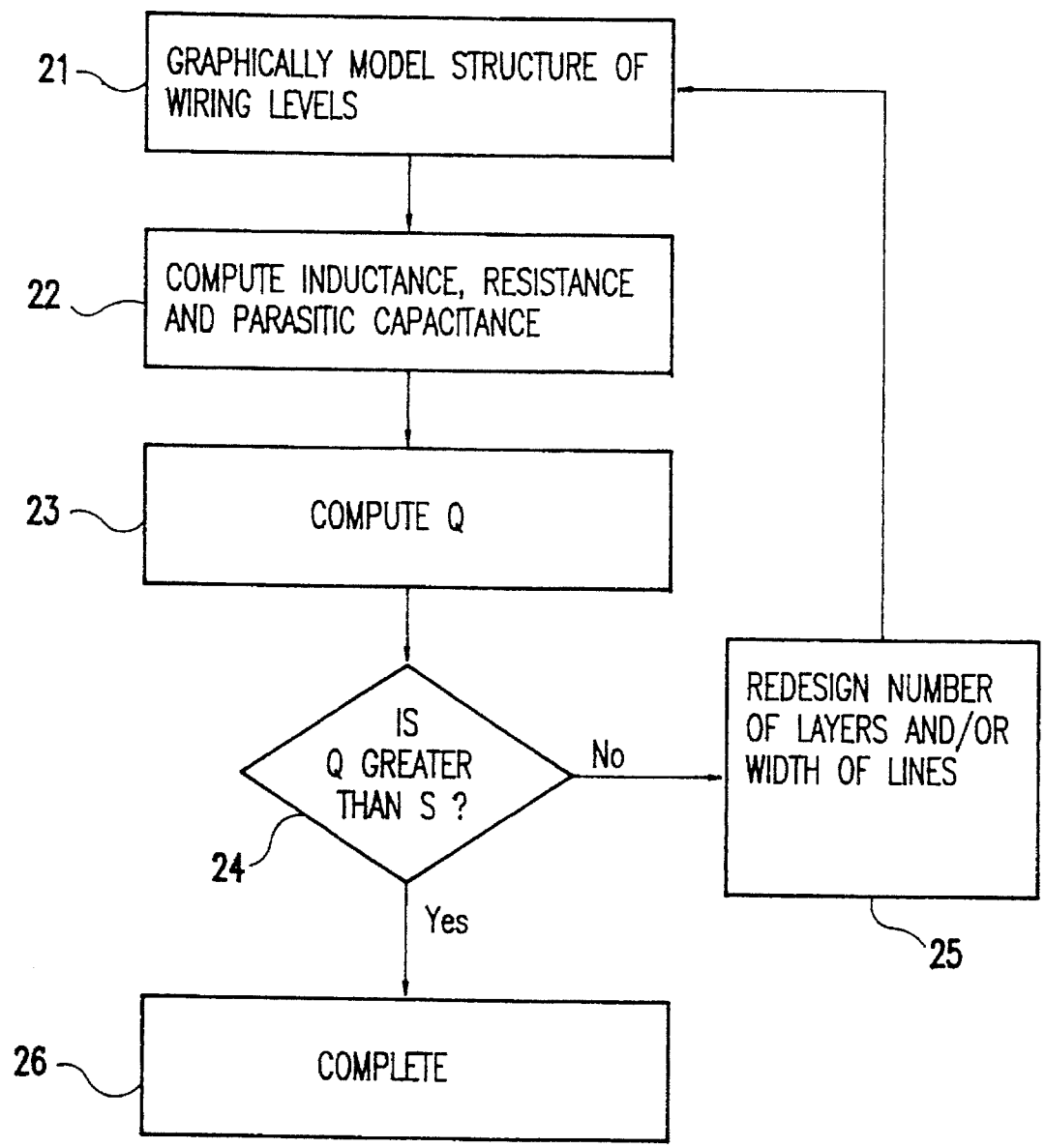
FIG. 5 is a flow diagram of the method according to this invention.

FIG. 5 is a flow chart showing the steps of the invention. First, the geometrical structure of the wiring levels of the conventional silicon technology and via holes which connect the different wiring levels to implement the turns using this invention is graphically modelled in function block 21. The graphical modelling front-end program used in a specific implementation of the invention is IDEAS developed by SDRC. Other geometric modeling software can be used as the front-end program in the practice of the invention. This software is used to create a geometrical model and a meshed model with triangular elements, of the resonator. The entire physical layout and material properties of the conductor and dielectric are specified in the graphical model.

Next, the inductance, resistance and parasitic capacitance are computed in function block 22. This computation is based on the physical dimensions developed by the geometrical modeling program. Utilizing the physical layout and material properties of the conductor and dielectric, a method of moments algorithm is used to compute inductance, resistance, and parasitic capacitance. In this algorithm, the geometry of the resonator is meshed into triangles. On each triangle, a piece wise constant charge distribution and a piece wise linear current distribution is assumed. The resistance, inductance and capacitance are computed based on these assumptions. Then the Q factor is computed in function block 23, using the computed inductance, resistance, and parasitic capacitance. The algorithm is described in more detail in the article by Saila Ponnapalli et al. entitled "Package Analysis Tool", published in *IEEE Transactions on Components, Hybrids, and Manufacturing Technology*, Vol. 16, No. 8, December 1993, pp. 884–892.

A test is next made in decision block 24 to determine whether the Q factor is greater than five. If the Q factor is greater than five, then the process is complete at function block 26. However, if the Q factor is not greater than five, the process loops back to function block 21, and the number of layers and/or width of the lines is redesigned, modeling a new structure. This iterative process is continued until a Q greater than five is achieved.

The inductor designed by this process employs multiple layers of metal connected with via holes through the isolation levels, as described above. Most of the silicon technologies at present have at least three or more metal layers for wiring the circuits. The first metal level has to be used as cross-under to make a connection to the interior terminal of the spiral structure, thus leaving at least two layers to be used for the inductor turns. This reduces the DC resistance of the inductor at least by a factor of two, hence providing a large Q enhancement. Obviously, one can further decrease the DC resistance of the structure by shunting more metal layers if extra inductance, resistance and parasitic capacitance, each of which, especially inductance, cannot be computed accurately with approximate formulas. The present invention can be used to predict inductance, capacitance and resistance for such a structure.

EXAMPLE

A spiral inductor was modelled using the extraction tool described and was implemented in hardware using a mature BiCMOS technology. The exact dimensions of the spiral inductor were graphically input into the extraction tool. The conductors were assumed to be ideal and the dielectric was assumed to be lossless. The inductance which was obtained using the tool was 1.9 nil. The measured inductance was 2.2 nil. The measured Q of a four turn spiral inductor is at least seven at 2.4 GHz. It uses two metal levels to implement the turns and a third one for the cross under. The inductor also performed well as part of a resonator in a 2.4 GHz oscillator configuration. The accurate prediction of the inductance of the spiral aided in the hardware performing to expectation on the first iteration.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for designing a high-Q spiral inductor as part of an integrated circuit, the spiral inductor being implemented in a plurality of wiring levels in the integrated circuit, the comprising the steps of:

(a) graphically modeling a geometrical structure of the plurality of wiring levels and via holes which connect said wiring levels to implement a plurality of spiral turns of the inductor;

(b) computing an inductance, resistance and parasitic capacitance for the modeled geometrical structure using a method of moments algorithm;

(c) computing a Q factor based on said computed inductance, resistance, and parasitic capacitance; and (d) determining if the Q factor for the modeled geometric structure is greater than a predetermined value;

(e) redesigning a number of layers or width of lines of the geometric structure if the Q factor is not greater than said predetermined value; and (f) repeating steps (a) through (e) until a sufficiently high Q is obtained.

2. The method recited in claim 1 wherein said step of graphically modeling is performed using a computer software graphical modeling program which creates a graphical model and a meshed model with triangular elements of a resonator structure including the inductor.

3. The method recited in claim 2 wherein step (b) is performed using the method of moments algorithm in which the geometry of the resonator structure is meshed into triangles in which a piece wise constant charge distribution and a piece wise linear current distribution is employed.

4. A computer implemented method of designing a high Q monolithic inductor structure formed using a conventional silicon technology comprising at least first and second metal levels separated from one another by a first insulating layer, said first and second metal levels being formed with identical spiral patterns and connected through via holes in the first insulating layer to implement parallel connected turns of the inductor structure having a low resistance value, said method comprising the steps of:

(a) graphically modeling a geometrical structure of the plurality of wiring levels and via holes which connect said wiring levels to implement a plurality of spiral turns of the inductor;

(b) computing an inductance, resistance and parasitic capacitance for the modeled geometrical structure using a method of moments algorithm;

(c) computing a Q factor based on said computed inductance, resistance, and parasitic capacitance;

(d) determining if the Q factor for the modeled geometric structure is greater than a predetermined value;

(e) redesigning a number of layers or width of lines of the geometric structure if the Q factor is not greater than said predetermined value; and (f) repeating steps (a) through (e) until a sufficiently high Q is obtained.

5. The method recited in claim 4 wherein said step of graphically modeling is performed using a computer software graphical modeling program which creates a graphical model and a meshed model with triangular elements of a resonator structure including the inductor and wherein step (b) is performed using the method of moments algorithm in which the geometry of the resonator structure is meshed into triangles in which a piece wise constant charge distribution and a piece wise linear current distribution is assumed.

* * * * *